(12) United States Patent
Ozasa

(10) Patent No.: US 9,548,745 B2
(45) Date of Patent: Jan. 17, 2017

(54) PHASE-DETECTOR CIRCUIT AND CLOCK-DATA RECOVERY CIRCUIT

(71) Applicant: Dan Ozasa, Yokohama (JP)

(72) Inventor: Dan Ozasa, Yokohama (JP)

(73) Assignee: RICOH COMPANY, LTD., Tokyo (JP)

(*) Notice: Subject to any disclaimer, the term of this patent is extended or adjusted under 35 U.S.C. 154(b) by 220 days.

(21) Appl. No.: 14/277,141

(22) Filed: May 14, 2014

(65) Prior Publication Data

US 2014/0340121 A1 Nov. 20, 2014

(30) Foreign Application Priority Data

May 15, 2013 (JP) ................... 2013-103136

(51) Int. Cl.
*H03L 7/087* (2006.01)
*H03L 7/089* (2006.01)

(52) U.S. Cl.
CPC ............. *H03L 7/0891* (2013.01); *H03L 7/087* (2013.01); *H03L 7/089* (2013.01)

(58) Field of Classification Search
CPC ........................................ H03L 7/087–7/0891
See application file for complete search history.

(56) References Cited

U.S. PATENT DOCUMENTS

| 5,633,899 A | 5/1997 | Fiedler et al. | |
| 6,026,134 A * | 2/2000 | Duffy | H03L 7/087 |
| | | | 327/12 |
| 6,041,090 A * | 3/2000 | Chen | H03L 7/0891 |
| | | | 327/148 |
| 6,421,404 B1 | 7/2002 | Nakamura | |
| 7,330,058 B2 * | 2/2008 | Lin | H03L 7/0893 |
| | | | 327/148 |
| 7,532,038 B2 * | 5/2009 | Lin | H03D 13/004 |
| | | | 327/12 |
| 2004/0183891 A1 | 9/2004 | Ishida et al. | |
| 2004/0251973 A1 | 12/2004 | Ishida et al. | |
| 2005/0219354 A1 | 10/2005 | Omori et al. | |
| 2006/0049893 A1 | 3/2006 | Ozasa et al. | |
| 2007/0080753 A1 | 4/2007 | Ishida et al. | |
| 2007/0126517 A1 | 6/2007 | Ozasa | |
| 2009/0074125 A1 | 3/2009 | Lin | |
| 2009/0167837 A1 | 7/2009 | Ishida et al. | |
| 2009/0212713 A1 | 8/2009 | Ozasa | |
| 2012/0249717 A1 | 10/2012 | Ozasa | |

FOREIGN PATENT DOCUMENTS

JP 3106725 6/2001

* cited by examiner

*Primary Examiner* — Patrick O'Neill
(74) *Attorney, Agent, or Firm* — Cooper & Dunham LLP

(57) ABSTRACT

A phase-detector circuit is disclosed. The phase-detector circuit comprises a plurality of phase comparators which detects a phase difference between receipt data and a clock signal of a plurality of clock signals having the same frequency and phase difference of a predetermined angle with each other, and generates and outputs signals for up/down signals for synchronizing a phase. The phase comparator generates and outputs a signal for the up/down signals having a pulse width including a detected phase-time difference and a predetermined delay time.

5 Claims, 16 Drawing Sheets

PHASE-DETECTOR CIRCUIT 10

VCO 33

DATA-SAMPLING PART 34

PHASE-DETECTOR CIRCUIT AND CLOCK-DATA RECOVERY CIRCUIT

CROSS-REFERENCE TO RELATED APPLICATION

The present application is based on and claims priority from Japanese Patent Application No. 2013-103136, filed on May 15, 2013, the disclosure of which is hereby incorporated by reference herein in its entirety.

BACKGROUND

Field of the Invention

The present invention relates to a phase-detector circuit which outputs an up/down signal according to a phase-difference between a data signal and a clock signal, and a clock-data recovery circuit including the phase-detector circuit.

Generally, a clock-data recovery circuit is configured with a phase-detector circuit (PD), a charge pump (CP), a voltage-control oscillator (VCO), and a loop filter (LPF). A Hodge-phase comparator is known as such a phase-detector circuit. The Hodge-phase comparator requires a 4 GHz clock in order to receive a signal of 4 Gbps. In this regard, it requires a faster clock as the data rate becomes faster, so it is difficult to achieve implementation corresponding to the speeding-up. In order to solve the above problem, as disclosed in JP Patent publication No. 3196725B, a half-rate phase comparator having a clock capable of importing data at a speed of 2 GHz when the data rate is 4 Gbps is already known.

However, in the half-rate phase comparator, each pulse width of UP, DN signals as the output signals of the phase comparator is 1 UI (Unit interval) or less. In particular, it becomes 0.5 UI during the phase synchronization. When the data rate is at 4 Gbps, the pulse width is as narrow as 125 ps. According to the manufacturing process or the type of device, it is difficult to maintain an accurate pulse width until the charge pump is driven. Thus, there is a problem in that the precision of the phase synchronization falls.

SUMMARY

In light of the above, an object of the present invention aims to provide a phase-detector circuit which can output up/down signals having sufficient pulse width in a high-speed communication, and a clock-data recovery circuit including the phase-detector circuit.

In order to accomplish the above-described object, a phase-detector circuit according to Embodiments of the present invention includes a plurality of phase comparators which detects a phase difference between received data and a clock signal of a plurality of clock signals having the same frequency and phase difference of a predetermined angle with each other, and generates and outputs signals for up/down signals for synchronizing a phase; wherein the phase comparator generates and outputs a signal for the up/down signals having a pulse width including a detected phase-difference time and a predetermined delay time.

BRIEF DESCRIPTION OF THE DRAWINGS

The accompanying drawings are included to provide further understanding of the invention, and are incorporated in and constitute a part of this specification. The drawings illustrate embodiments of the invention and, together with the specification, serve to explain the principle of the invention.

DETAILED DESCRIPTION OF THE PREFERRED EMBODIMENT

Hereinafter, a description will be given below of a phase-detector circuit and a clock-data recovery circuit according to Embodiments of the present invention with reference to the figures.

Embodiment 1

Figure 1:
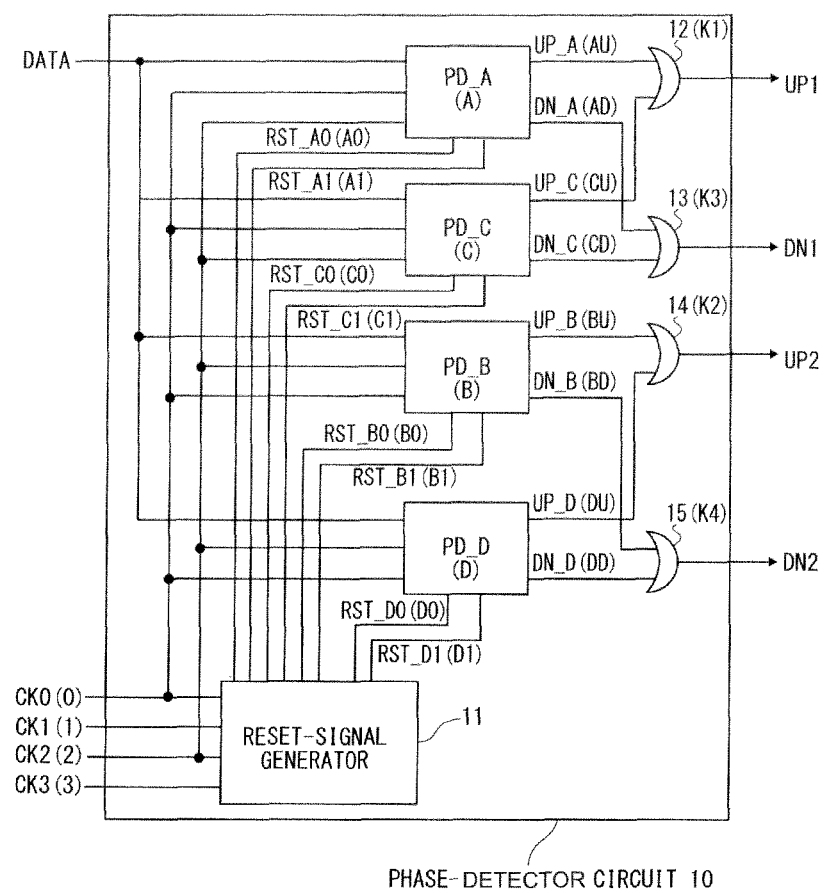
FIG. 1 is a circuit diagram of a phase-detector circuit according to Embodiment 1 of the present invention.

A phase-detector circuit 10 shown in FIG. 1 is used in a clock-data recovery circuit for high-speed serial communication.

The phase-detector circuit 10 includes a reset-signal generator 11 which generates a reset signal, phase comparators PD_A to PD_D (A to D), and OR circuits 12 to 15 (K1 to K4).

Figure 2:
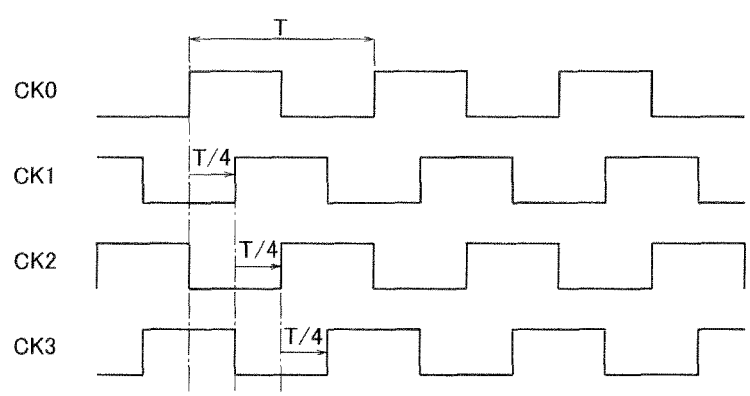
FIG. 2 is an explanatory view illustrating a time-chart of a clock signal being used in the phase-detector circuit shown in FIG. 1.
Figure 3:
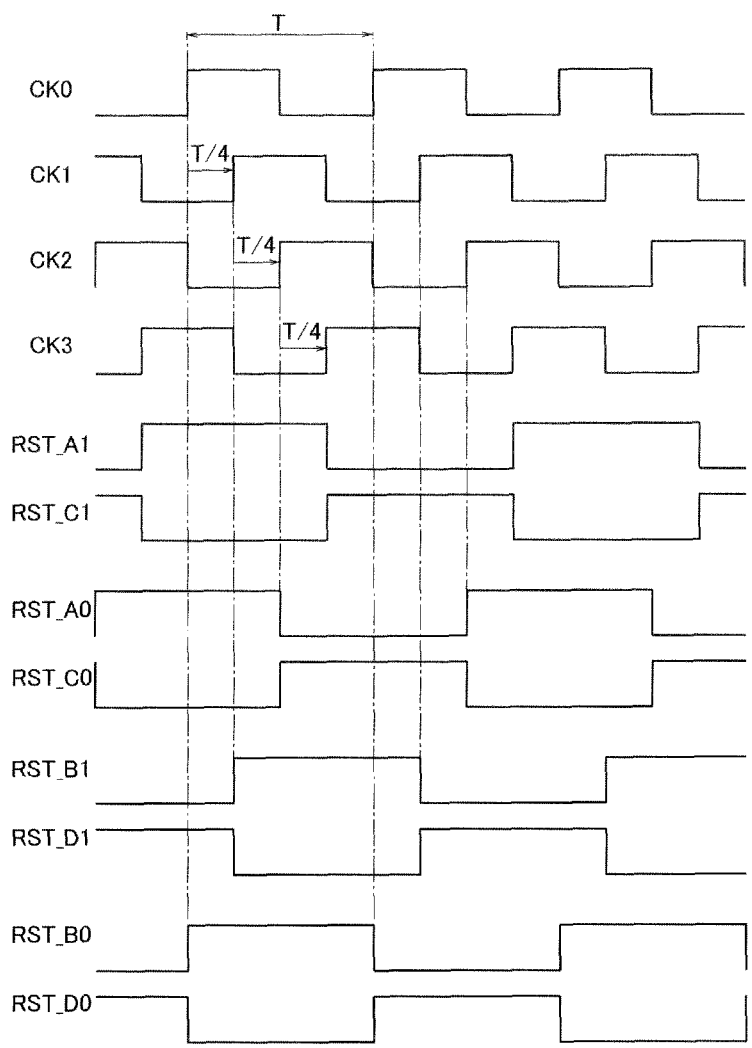
FIG. 3 is a time chart illustrating the behavior of the phase-detector circuit as shown in FIG. 1.

As shown in FIG. 2, the reset-signal generator 11 receives clock signals CK0, CK1, CK2, and CK3 (0 to 3) having a phase difference per period T (¼) for each, and as shown in FIG. 3, the reset-signal generator 11 generates and outputs eight reset signals RST_A0, RST_A1, RST_B0, RST_B1, RST_C0, RST_C1, RST_D0, RST_D1 (A0, A1, B0, B1, C0, C1, D0, D1) having a double period.

A frequency of each clock signal CK0, CK1, CK2, and CK3 is a half-data rate compared to serial communication. Each clock signal has a phase-difference of 90 degrees in between. In the clock-data recovery circuit, the period T of the clock is controlled so as to be twice the data rate (1 UI of data=T/2).

Figure 4:
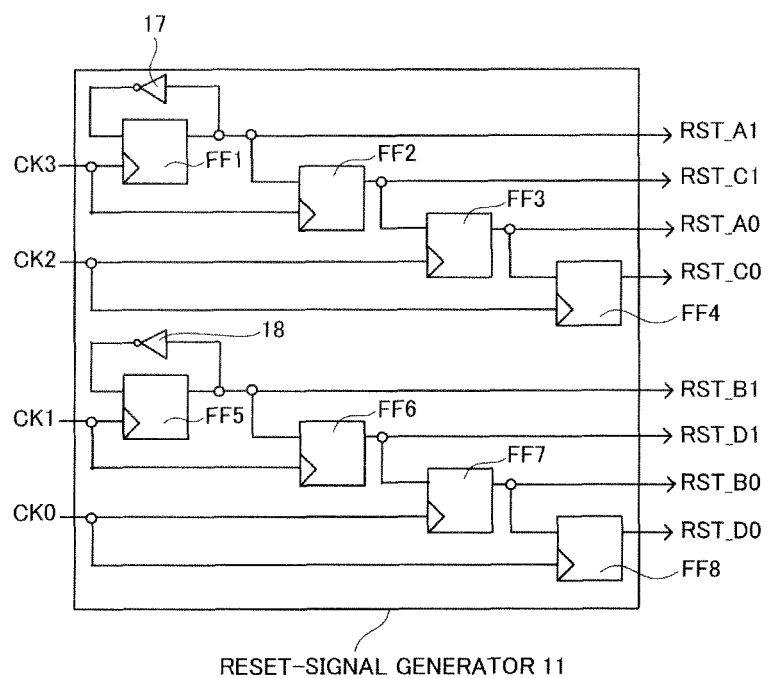
FIG. 4 is a circuit diagram illustrating a reset-signal generator of the phase-detector circuit shown in FIG. 1.

As shown in FIG. 4, the reset-signal generator 11 is configured with eight flip-flops FF1 to FF8 and two inverters 17 and 18. The flip-flops FF1 and FF5 divide the frequencies of the clock signals CK3 and CK1 by 2. The flip-flops FF3 and FF4 divide the frequency of the clock signal CK2 by 2. The flip-flops FF7 and FF8 divide the frequency of the clock signal CK0 by 2.

As shown in FIG. 3, because each phase difference of the clock signals CK0. CK1, CK2, and CK3 is 90 degrees in between, the reset signal RST_A0 and the reset signal RST_A1 have a phase difference of T/4 periods. Similarly, each phase difference of the reset signals RST_B0 and RST_B1, the reset signals RST_C0 and RST_C1, and the reset signals RST_D0 and RST_D1 is T/4 periods. In addition, each phase difference of the reset signals RST_A0, RST_B0, RST_C0, and RST_D0 is T/2 periods in between.

Figure 5:
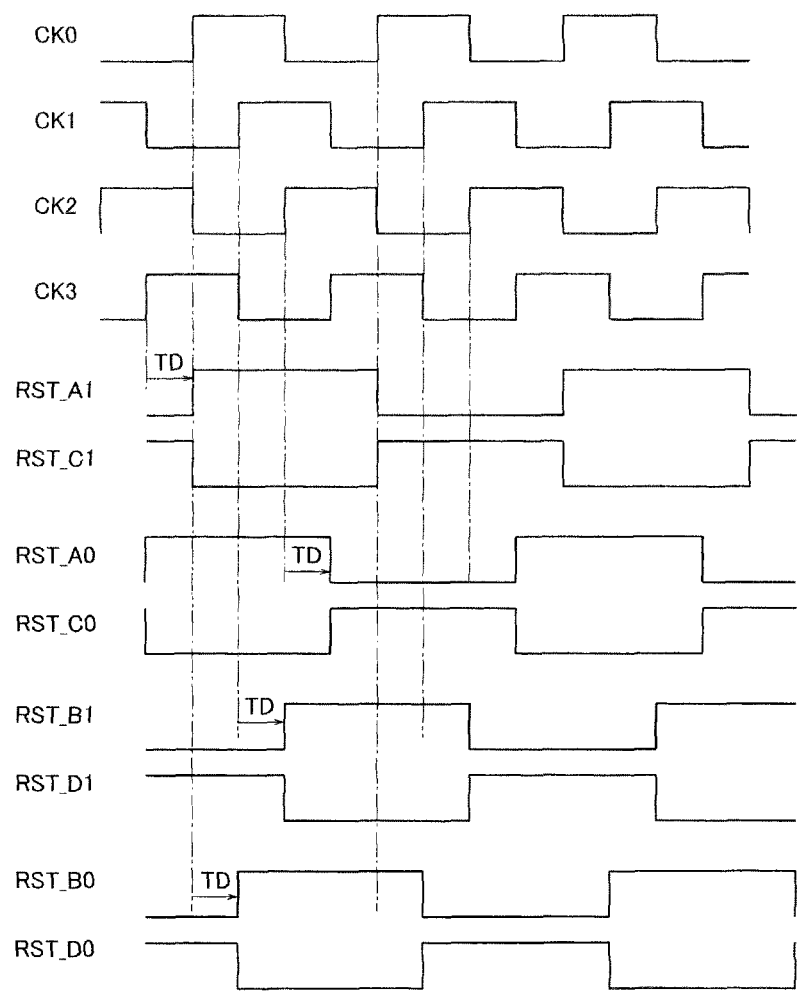
FIG. 5 is a time chart illustrating a state of output delay.

Alternatively, when the circuit is implemented, the flip-flops FF1 to FF8 include a certain amount of output delay, so an output delay according to devices occurs. FIG. 5 illustrates a timing chart in which the output delay in the flip-flops FF1 to FF8 in FIG. 4 is TD (predetermined delay time). As compared with FIG. 4, FIG. 5 shows that each reset signal RST_A0, RST_A1, RST_B0, RST_B1, RST_C0, RST_C1, RST_D0, and RST_D1 is delayed from each clock signal CK0, CK1, CK2, and CK3.

Figure 6:
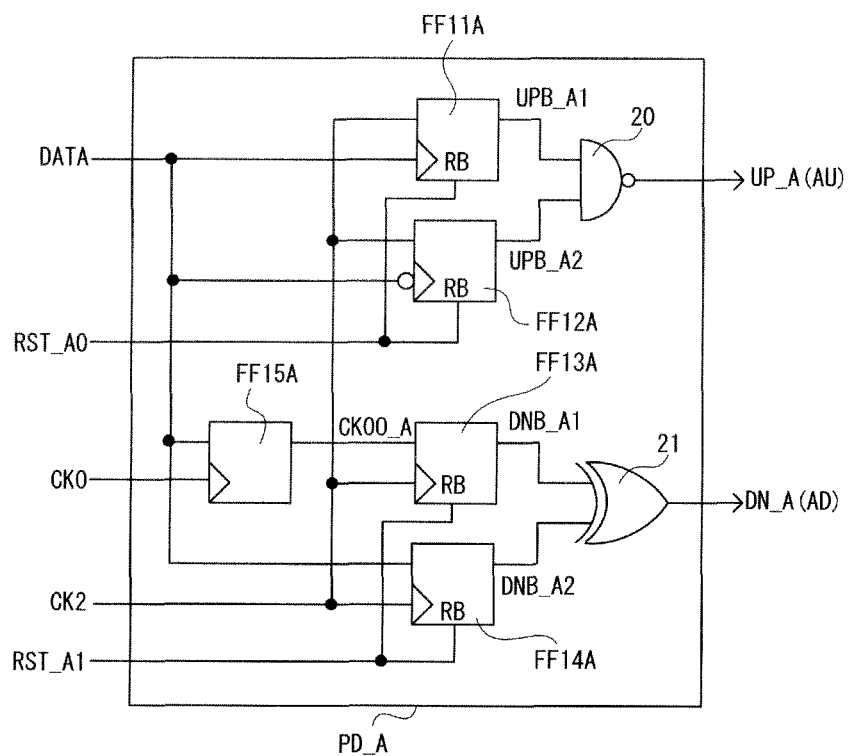
FIG. 6 is a circuit diagram illustrating a configuration of a first phase comparator provided in the phase-detector circuit shown in FIG. 1.

FIG. 6 is a circuit diagram illustrating a configuration of a first phase comparator PD_A. The phase comparator PD_A includes five flip-flops FF11A to FF15A, a NAND circuit 20, and an exclusive-logical addition circuit 21. The phase comparator PD_A receives received data DATA, clock signals CK0 and CK2, and the reset signals RST_A0 and RST_A1, and outputs a signal UP_A (AU) for an up signal and a signal DN_A (AD) for a down signal. One of the five flip-flops FF operates at a falling edge, and the remaining four flip-flops FF are the set-reset flip-flops. Herein, the output power of the set-reset flip-flops FF11A to FF14A is at high-level on the reset time.

Figure 7:
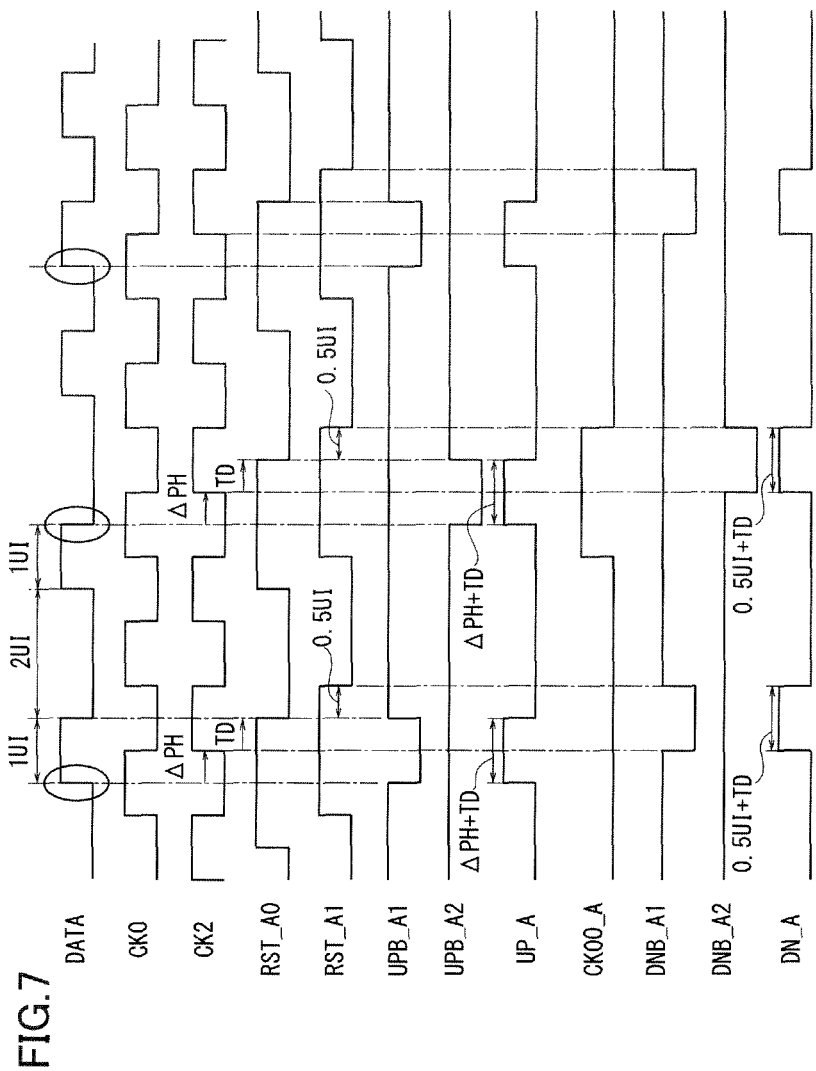
FIG. 7 is a time chart illustrating the behavior of the first phase comparator shown in FIG. 6.

FIG. 7 illustrates a timing chart of the phase comparator PD_A. FIG. 7 shows an example of a data pattern of the received data DATA. The received data DATA herein imports the clock signals CK0 and CK2 at each rising edge. The phase difference between the received data edge and the rising edge of the clock signals CK0 and CK2 is Δph (phase-difference time).

In addition, as described in FIG. 4, the actual output delay TD in the flip-flops FF3 and FF1 of the reset-signal generator 11 in relation to the reset signals RST_A0 and RST_A1 is shown. Although an output delay also occurs in each flip-flop FF11A to FF14A in relation to output signals UPB_A1 and UPB_A2 for the up signal or output signals DNB_A1 and DNB_A2 for the down signal actually, it is omitted herein because it has no relation to the feature of Embodiment 1.

Hereinafter, a generation step of a signal UPT_A for the up signal is described with reference to the time chart shown in FIG. 7.

As shown in FIG. 7, under the condition that the reset signal is high and the clock signal CK2 is low, a signal UP_A for the up signal is generated according to the rising or falling of the received data DATA. The output signal UPB_A1 falls when the received data DATA rises, and the output signal UPB_A1 rises when the reset signal RST_A0 becomes low (introduced into reset). That is, a time rag between the rise time of the received data DATA and the falling time of the reset signal RST_A0 (phase-difference time+prescribed delay time, that is, Δph+TD) is retrieved as a pulse width of the output signal UPB_A1.

Under the condition that the reset signal RST_A0 is high and the clock signal CK2 is low, the output signal UPB_A2 falls when the received data DATA falls, and the output signal UPB_A2 rises when the reset signal RST_A0 becomes low (introduced into reset). That is, a time rag between the falling time of the received data DATA and the falling time of the reset signal RST_A0 (Δph+TD) is retrieved as a pulse width of the output signal UPB_A2. Herein, each of the rising and falling edges of the received data DATA is called as a transition edge of the received data DATA.

Thus, the signal UP_A is generated by picking up NAND information regarding the output signals UPB_A1 and UPB_A2 generated as described above. The pulse width of the signal UP_A is detected so as to include the time rag between the edge of the received data DATA and the falling time of the reset signal RST_A0 (Δph+TD) according to the rise or fall of the received data DATA, when the reset signal RST_A0 is high and the clock signal CK2 is low.

Next, a description of the generating step of the signal DN_A is given below. Initially, clock signal CK0O_A is generated by retrieving the received data DATA in the clock CK0. The output signal DNB_A1 is generated by retrieving the clock data CK0O_A, and the output signal DNB_A2 is generated by retrieving the received data DATA, when the clock signal CK2 rises under the condition that the reset signal RST_A1 is high. Each output signal DNB_A1 and DNB_A2 becomes high when the reset signal RST_A1 falls. Then, the signal DN_A is generated from an exclusive logical addition of the output signal DNB_A1 and DNB_A2.

In other words, the signal DN_A is detected in the case in which the received data DATA changes during the time period between the rising of clock signal CK0 and the rising of clock signal CK2 under the condition that the rest signal RST_A1 is high. Such a time period is 0.5 UI+TD as shown in FIG. 7. Although the phase difference between the reset signals RST_A0 and RST_A1 is shown as T/4 in FIG. 3, it is shown as 0.5 UI in FIG. 7 because it is calculated as 1 UI=T/2 under the condition that each frequency of the received data and each frequency of the clock signal are synchronized, in the clock-data recovery circuit.

Figure 8:
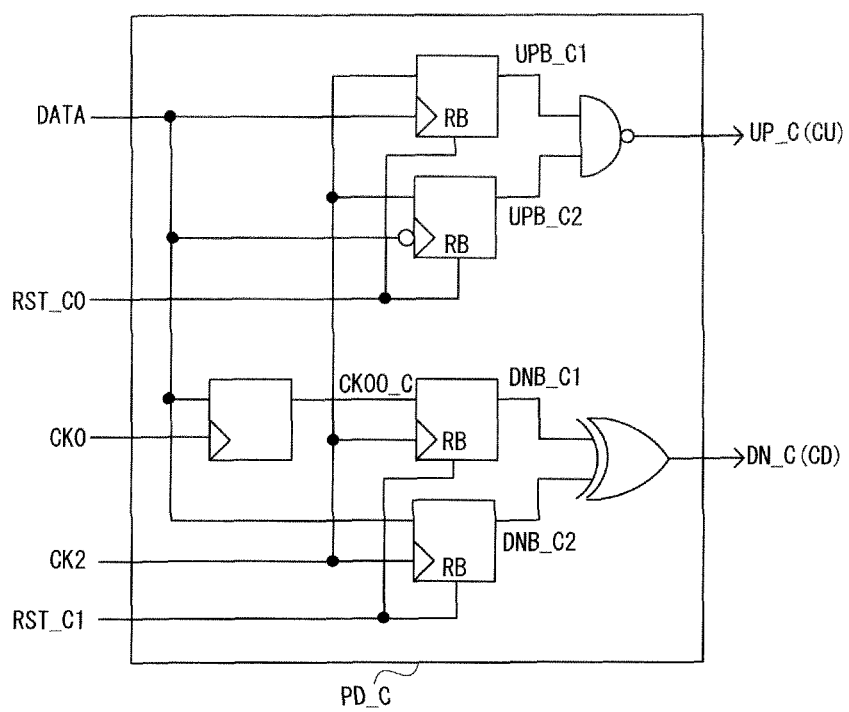
FIG. 8 is a circuit diagram illustrating a configuration of a second phase comparator provided in the phase-detector circuit shown in FIG. 1.

FIG. 8 is a circuit diagram illustrating a configuration of the phase comparator PD_C. The phase comparator PD_C is similar to the phase comparator PD_A shown in FIG. 6 except that the reset signals RST_C0 and RST_C1 are input as reset signals.

Similar to the above description, the phase comparator PDC generates a signal (CU) UP_C for the up signal by picking up NAND information between an output signal UPB_C1 and an output signal UPB_C2. A signal (Cd) DN_C for the down signal is generated by calculating an exclusive logical addition of output signals DNB_C1 and DNB_C2.

Figure 9:
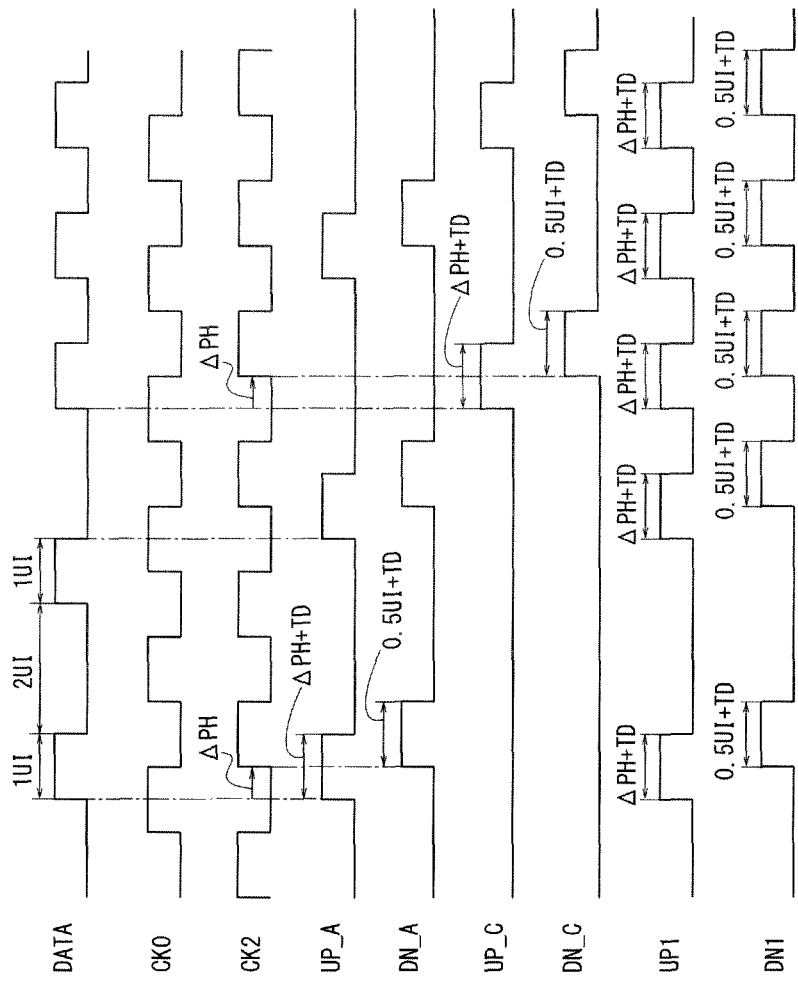
FIG. 9 is a time chart illustrating the behavior of the second phase comparator shown in FIG. 8.

FIG. 9 illustrates a timing chart of the signal UP_C and the signal DN_C in relation to an up signal UP1 and a down signal DN1 shown in FIG. 1. In FIG. 9, the relationship between the received data DATA and the clock signals CK0 and CK2 is similar to that of the timing chart shown in FIG. 7. The edge of the received data DATA and the rising edges of the clock signals CK0 and CK2 always include a difference of Δph.

According to FIG. 9, under the condition that the edge of the received data DATA is in the time period in which the clock signal CK2 is low, the signal UP_A and the signal DN_A are not detected but the signal UP_C and the signal DN_C are detected. In other words, the time period for detecting the edge by the phase comparator PD_A and the time period for detecting the edge by the phase comparator PD_C changes one after the other, under the condition that the clock signal CK2 is low.

The up signal UP1 is generated by picking up OR information between the signals UP_A and UP_C. The down signal DN1 is generated by picking up OR information between the signals DN_A and DN_C. Herein, the pulse width of the up signal UP1 is Δph+TD, and the pulse width of the down signal DN1 is 0.5 UI+TD.

In the clock-data recovery circuit, the pulse widths of the up signal and the down signal are controlled so as to be even during the process of phase synchronization between the received data DATA and the clock signal. The edge of the received data DATA is also controlled so as to be in between the rising edges of the clock signal CK0 and the clock signal CK2, because Δph+TD is 0.5 UI+TD; therefore, Δph=0.5 UI in the phase synchronization. Thereby, the margin from the edge of receiving data to the edge of the clock signal is maximized when the received data DATA is detected by the clock signal. Thus, an error in data recovery is prevented to the highest possible degree. Therefore, the stability during communication can be increased.

Figure 10:
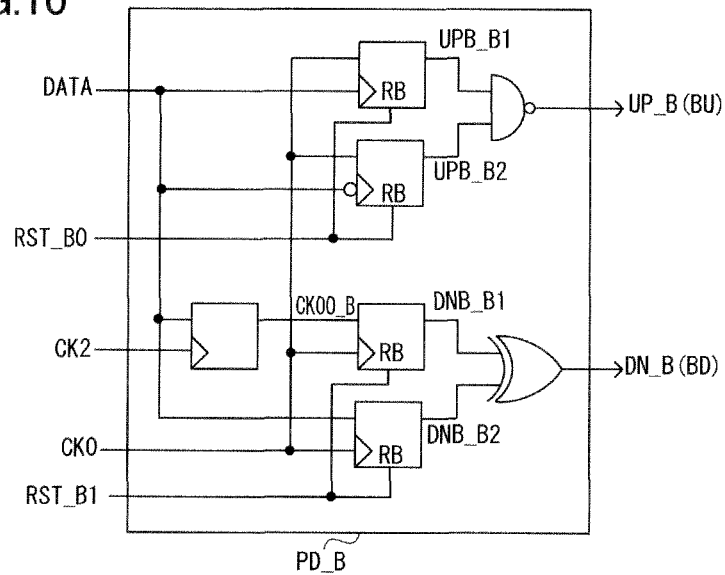
FIG. 10 is a circuit diagram illustrating a configuration of a third phase comparator provided in the phase-detector circuit shown in FIG. 1.

FIG. 10 is a circuit diagram illustrating a configuration of a phase comparator PD_B. The phase comparator PD_B is similar to the phase comparator PD_A as shown in FIG. 6, except that the reset signals RST_B0 and RST_B1 are input as reset signals, and clock signals CK0 and CK2 are input in an opposite manner to those in FIG. 6.

Similar to the above description, the phase comparator PD_B generates a signal (BU) UP_B for the up signal by picking up NAND information between an output signal UPB_B1 and an output signal UPB_B2. A signal (BD) DN_B for the down signal is generated by calculating the exclusive logical addition of the output signals DNB_B1 and DNB_B2.

Figure 11:
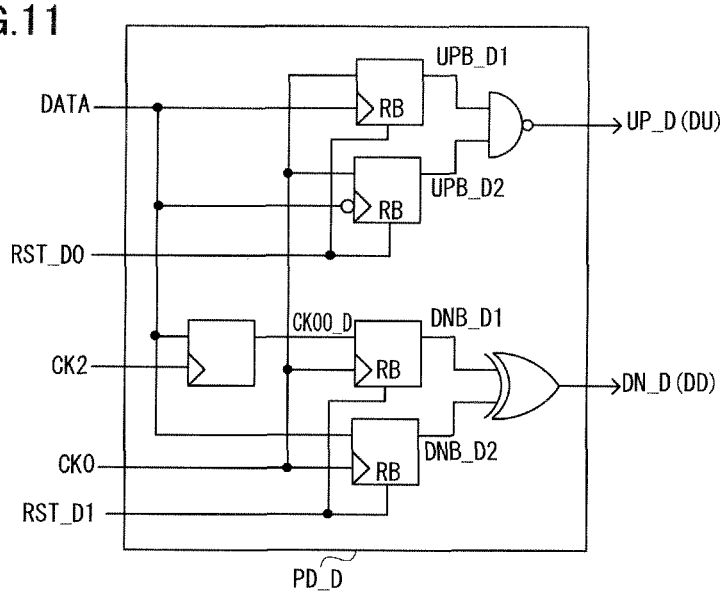
FIG. 11 is a circuit diagram illustrating a configuration of a fourth phase comparator provided in the phase-detector circuit shown in FIG. 1.

FIG. 11 illustrates a configuration of a phase comparator PD_D in FIG. 1.

The phase comparator PD_D is similar to the phase comparator PD_B as shown in FIG. 10, except that reset signals RST_D0 and RST_D1 are input as reset signals.

The phase comparator PD_D generates a signal (DU) UP_D for the up signal by picking up NAND information between output signals UPB_D1 and UPB_D2 for the up signal. A signal (DD) DN_D for the down signal is generated by calculating exclusive logical addition of the output signals DNB_D1 and DNB_D2.

Figure 12:
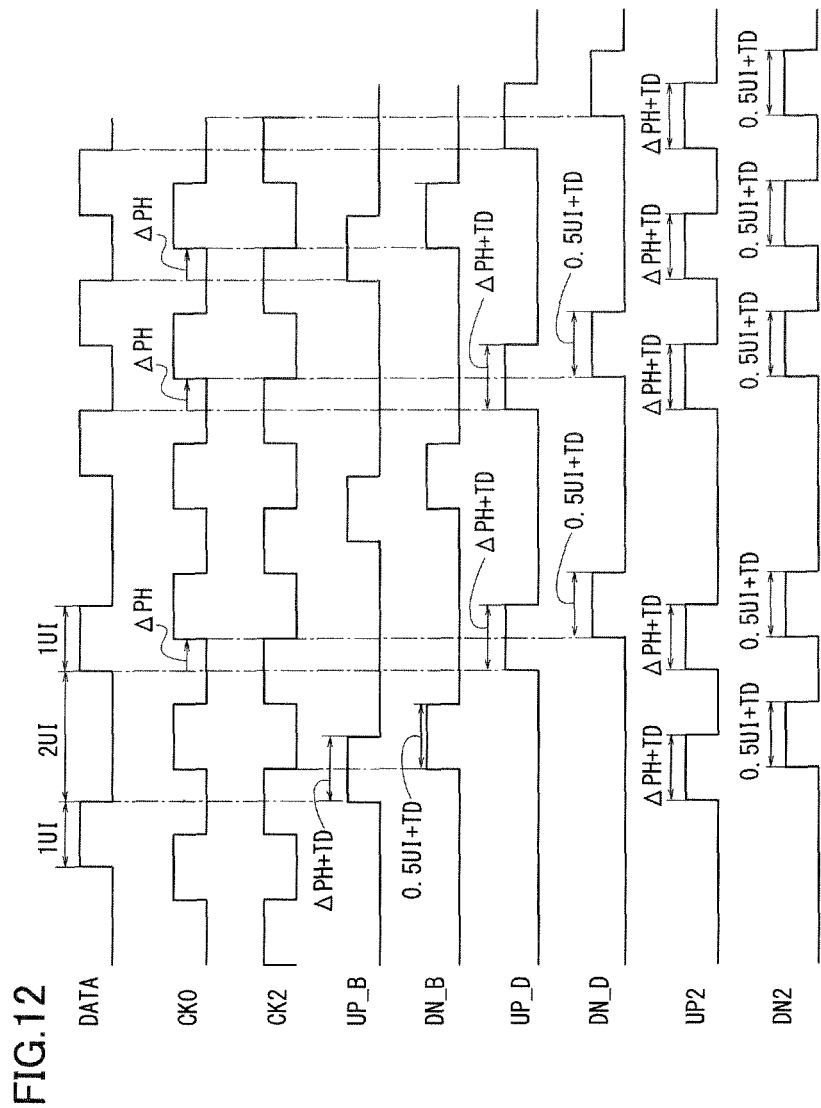
FIG. 12 is a time chart illustrating the behavior of the second and fourth phase comparators.

FIG. 12 illustrates a timing chart of each behavior of the phase comparators PD_B and PD_D, and an up signal UP2 and a down signal DN2 shown in FIG. 1. The relationship between the received data DATA and the clock signals CK0 and CK2 in FIG. 12 is similar to that shown in the timing chart in FIG. 9. In essence, the generation step of the signals UP_B and UP_D and the signals DN_B and DN_D is similar to that in the timing chart in FIG. 9, but the detection is operated under the condition that the edge of the received data DATA is within the time period in which the clock signal CK0 is low because the connection of the clock signals CK0 and CK2 is opposite to that in FIG. 6 or 8. The up signal UP2 is generated by picking up OR information of the signals UP_B and UP_D. The down signal DN2 is generated by calculating exclusive logical addition of the signals DN_B and DN_D. The pulse width of the up signal UP2 is Δph+TD and the pulse width of the down signal is 0.5 UI+TD.

Similar to FIG. 9, in the clock-data recovery circuit, the pulse widths of the up signal UP2 and the down signal DN2 are controlled so as be even during the process of the phase synchronization of the received data DATA and the clock signal. Under the condition of phase synchronization, Δph+TD becomes 0.5 UI+TD, that is Δph=0.5 UI, so the edge of the received data DATA is controlled so as to be in between the rising edges of the clock signals CK2 and CK0. Thereby, in the clock-data recovery circuit, the margin from the edge of the received data to the edge of the clock signals is maximized when the received data is detected by the clock signal. Thus, errors in data recovery can be prevented to the highest possible degree. Therefore, stability in communication can be increased.

Therefore, as described above, the phase comparators PD_A to PD_D according to Embodiment 1 detect the phase difference between the received data DATA and the clock signal indirectly. The phase comparators PD_A to PD_D detect the phase difference between the reset signals generated from the clock signal, received data DATA, and clock signal as the pulse width. Thereby, each pulse width of the up signal and the down signal is ensured appropriately so as not to be too narrow, and an adequate pulse width can be ensured according to the type of device, the temperature, and the power-supply voltage. In particular, when the device is slow, the temperature is high, and the power-supply voltage is low, the pulse width becomes longer because the output delay TD becomes longer. Alternatively, the pulse width becomes narrow when the device is fast, temperature is low, and the power-supply voltage is high. However, there is no problem because the performance of the device is fast in this case. Additionally, phase synchronization can be achieved with a high degree of accuracy because the pulse width of each up signal and down signal can be maintained in the phase comparators PD_A to PD_D according to Embodiment 1.

Figure 13:
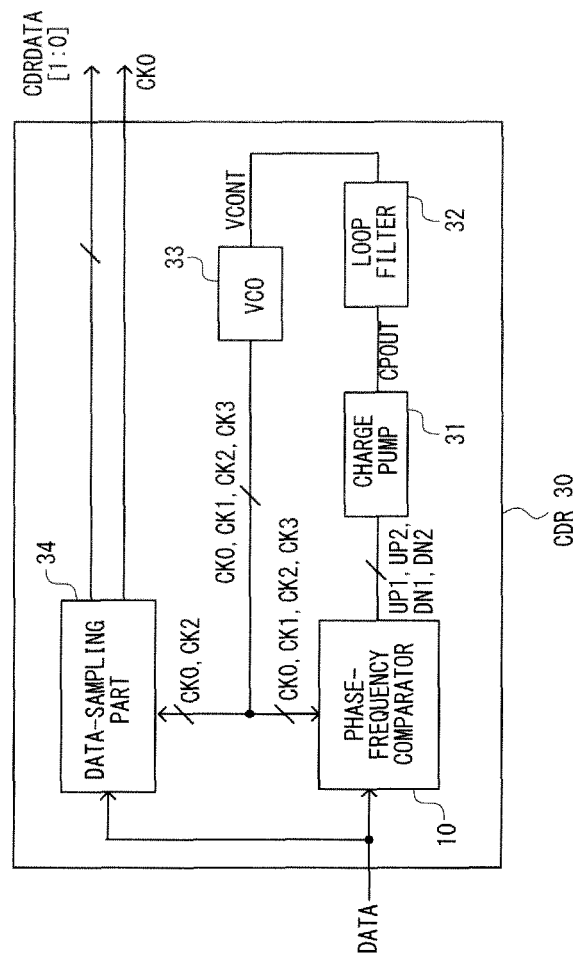
FIG. 13 is a circuit diagram illustrating a configuration of a clock-data recovery circuit.

FIG. 13 illustrates the circuit configuration in a case in which the phase-detector circuit 10 is applied to the clock-data recovery circuit 30.

The clock-data recovery circuit 30 is configured with the phase-detector circuit 10, charge pump 31, a loop filter 32, a voltage-control oscillator (VCO) 33, and a data-sampling part 34. A negative-feedback circuit is configured of the phase-detector circuit 10, the charge pump 31, the loop filter 32, and the voltage-control oscillator (VCO) 33. The phase-detector circuit 10 and the data-sampling part 34 are controlled so that the phase of received data DATA and the phase of clock signals (CK0, CK1, CK2, and ck3) are synchronized with each other.

The data-sampling part 34 samples the received data DATA through the phase-synchronized clock signals CK0 and CK2, and synchronizes it with the clock signal CK0 (recovery-clock signal) so as to output 2 bit data (CDRDATA) as recovery data.

Figure 14:
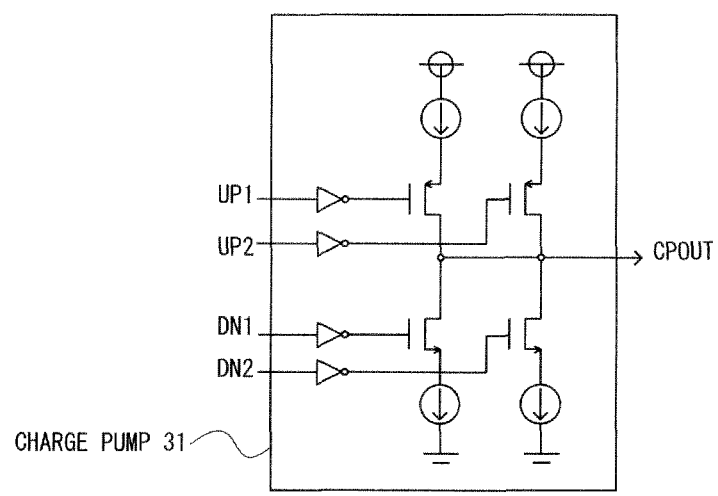
FIG. 14 is a circuit diagram illustrating a configuration of a charge pump shown in FIG. 13.

FIG. 14 illustrates a configuration of the charge pump 31. In the phase-detector circuit 10 according to Embodiment 1, two up signals and two down signals are generated; so two ordinary charge pumps 31 are provided. The inverter is clearly shown in FIG. 14. This is because it is difficult to maintain an appropriate pulse width after passing through the inverter if the widths of the up and down signals are narrow in the conventional phase comparators. It would disappear in a worst case scenario. Taking this into account, the phase-detector circuit 10 is configured so as to maintain an appropriate pulse width in Embodiment 1.

Figure 15:
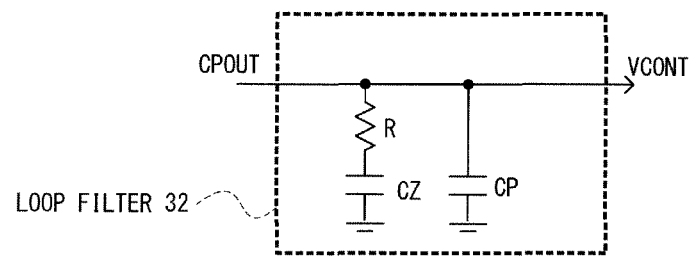
FIG. 15 is a circuit diagram illustrating a configuration of a loop filter shown in FIG. 13.

FIG. 15 illustrates an example of the circuit of the loop filter 32. The loop filter 32 is configured with a resistance R and capacitors Cz, Cp, similar to ordinal filters. According to the constant numbers of the resistance R and the capacitors Cz, Cp, the loop band of the clock-data recovery circuit 30 in FIG. 13 is determined. A voltage CPOUT for the output signal which is output from the charge pump 31 is smoothed by the loop filter 32. Then, the loop filter 32 outputs a voltage VCONT for the control signal.

Figure 16:
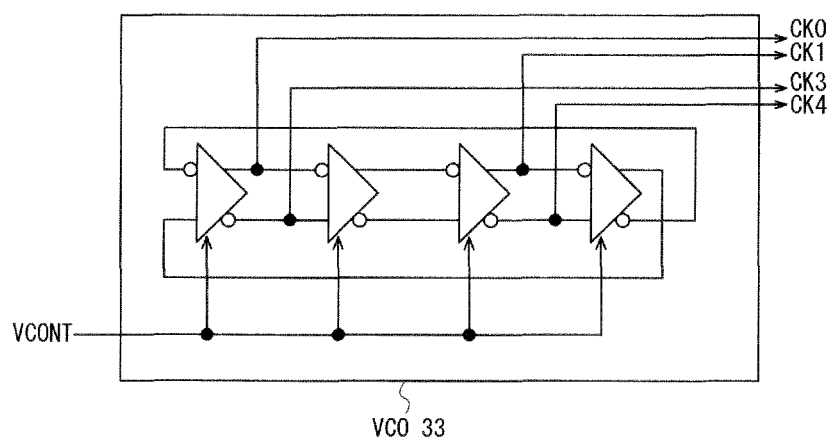
FIG. 16 is a circuit diagram illustrating a configuration of a voltage-control oscillator shown in FIG. 13.

FIG. 16 illustrates a configuration of the voltage-control oscillator 33. In Embodiment 1, the voltage-control oscillator 33 is configured to have a so-called ring-type VCO configuration because four clock signals having phase differences of 90 degrees for each are required. The analog control voltage of the output voltage VCONT which is output from the loop filter 32 is input so that the voltage control oscillator 33 outputs clock signals CK0, CK1, CK2, CK3 after oscillating by a frequency according to the value of the output voltage VCONT.

Figure 17:
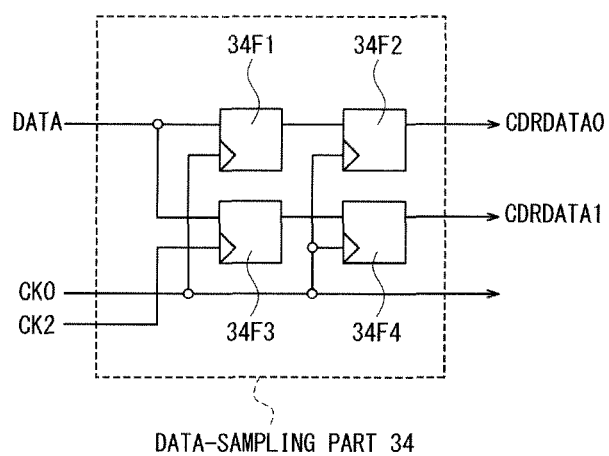
FIG. 17 is a circuit diagram illustrating a configuration of a data-sampling part shown in FIG. 13.

FIG. 17 illustrates an example of a circuit configuration of the data-sampling part 34. The data-sampling part 34 is configured of four flip-flops 34F1 to 34F4, and samples the received data DATA with the clock signals CK0 and CK2 which are phase-synchronized with the received data DATA in the phase-detector circuit 10. The sampled received data DATA is further synchronized with the clock signal CK0, and is output as clock-data recovery data [1:0].

With such a configuration of the clock-data recovery circuit 30 shown in FIG. 13, the phases of the received data DATA and the clock signals CK0, CK1, CK2, CK3 are synchronized. Thereby, each pulse width of the up signal UP and the down signal DN can be controlled so as to be even. Therefore, ΔPH+TD=0.5 UI+TD, and ΔPH=0.5 UI, under the condition of phase synchronization. Thereby, the edge of the received data DATA is controlled so as to be in between the rising edges of the clock signal CK0 and the clock signal CK2. That is, the margin from the edge of receiving data DATA to the edge of the clock signals CK0, CK1, CK2, CK3 is maximized when the received data DATA is detected with the clock signals CK0, CK1, CK2, CK3 in the data-sampling part 34. Thus, an error in data recovery is prevented to the highest possible degree. Therefore, stability in communication can be increased.

Embodiment 2

Figure 18:
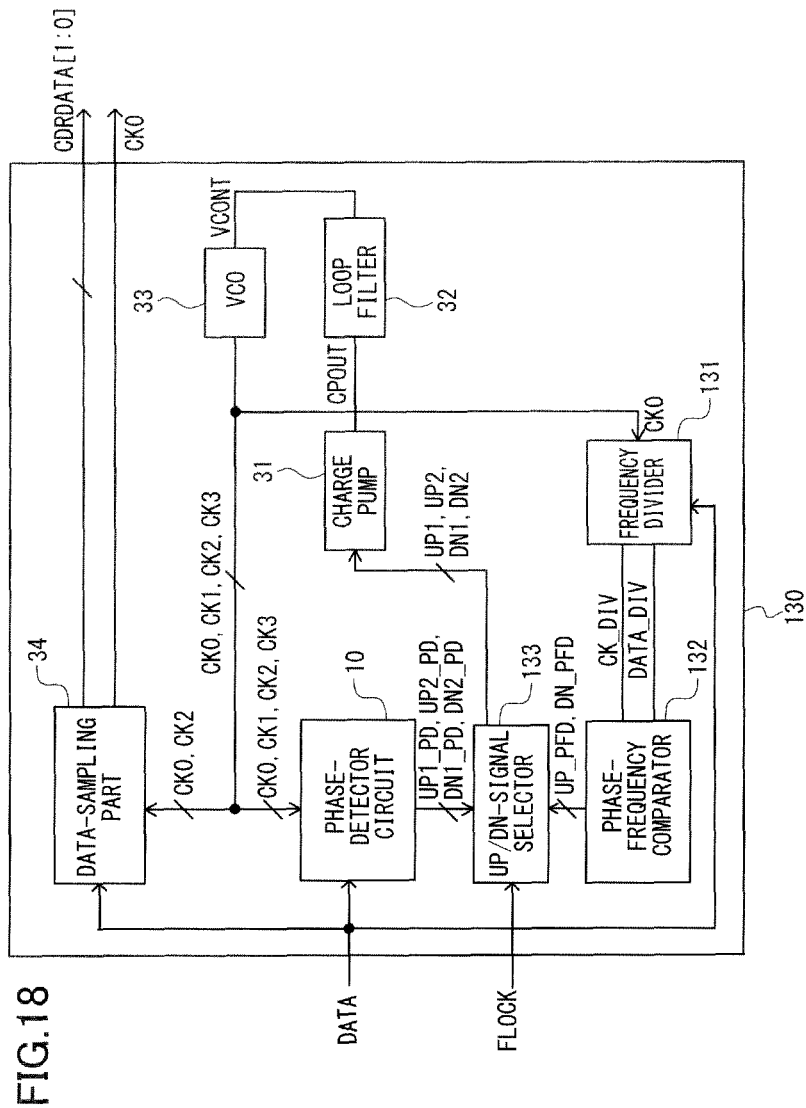
FIG. 18 is a circuit diagram illustrating a configuration of a clock-data recovery circuit according to Embodiment 2 of the present invention.

FIG. 18 illustrates a clock-data recovery circuit 130 according to Embodiment 2. The clock-data recovery circuit 130 further includes a frequency divider 131, a phase-frequency comparator 132, and an up/down-signal selector 133. In addition, the clock-data recovery circuit 30 includes the phase-detector circuit 10, the charge pump 31, the loop filter 32, the voltage-control oscillator (VCO) 33, and the data-sampling pert 34, as shown in FIG. 13. The above addition is made so as to improve the ability of leading the frequency.

In Embodiment 2, the time period "communication sequence" is defined as a signal which reverts per 1 UI when being sent as data during the frequency-synchronizing time period.

Figure 19:
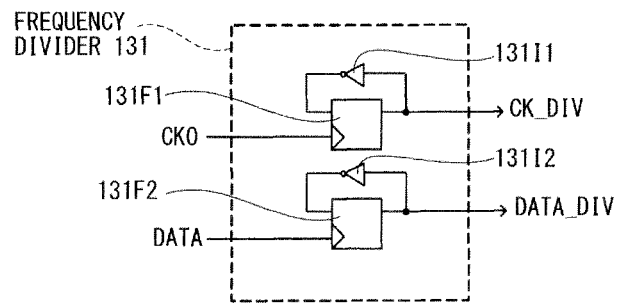
FIG. 19 is a circuit diagram illustrating a configuration of a frequency divider shown in FIG. 18.

As shown in FIG. 19, the frequency divider 131 generates a divided-clock signal CK_DIV by dividing the frequency of the clock signal CK0 into two through the flip-flop 131F1 and the inverter 131I1. The divided-received data DATA_DIV is generated by dividing the frequency of the received data DATA into two through the flip-flop 131F2 and the inverter 131I2.

Figure 20:
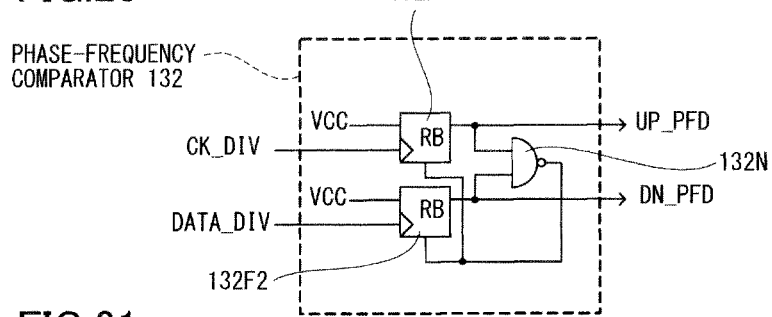
FIG. 20 is a circuit diagram illustrating a configuration of a phase-frequency comparator shown in FIG. 18.

As shown in FIG. 20, the phase-frequency comparator 132 is configured of flip-flops 132F1 and 132F2, and a NAND circuit 132N.

The frequency-divided clock signal CK_DIV and the frequency-divided data DATA_DIV which are output from the frequency divider 131 are input to the phase-frequency comparator 132. The phase-frequency comparator 132 generates an up-difference signal UP_PFD through the difference between the rising edges of the frequency-divided clock signal CK_DIV and the frequency-divided data DATA_DIV. A down-difference signal DN_PFD is generated through the difference between the rising edges thereof.

Herein, the frequency-divided clock signal CK_DIV and the frequency-divided data DATA_DIV are generated by dividing the clock and the data under the assumption that the data rate is rapid. However, the clock and the data can be input as they are as long as they do not affect the operation speed. The output value of the flip-flops 132F1 and 132F2 becomes low when the reset signal is input (that is, RB is low).

Figure 21:
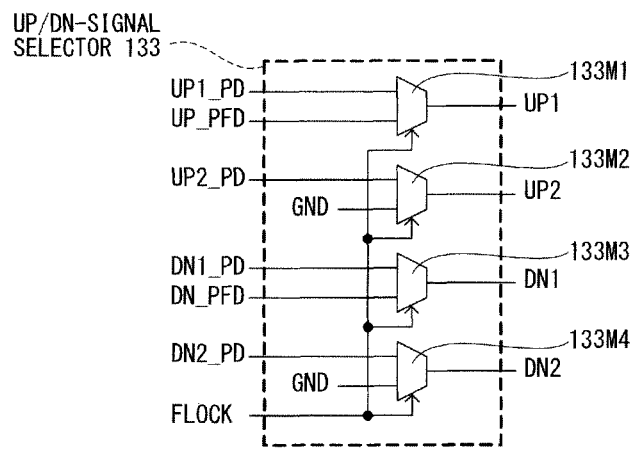
FIG. 21 is a circuit diagram illustrating an up/down-signal selector.

As shown in FIG. 21, the up/down-signal selector 133 is configured of four multiplexers 133M1 to 133M4.

The up/down-signal selector 133 selects the output from the phase-detector circuit 10 or the output from the phase-frequency comparator 132 according to a frequency-lock signal FLOCK which indicates that the frequencies of the received data DATA and the clock signals CK0, CK1, CK2, CK3 are synchronized with each other. However, because the phase-frequency comparator 132 includes only the up-difference signal UP_PFD and the down-difference signal DN_PFD as the output signal, GND (low level) is input to the multiplexers 132M2 and 133M4 for the up signal UP2 and the down signal DN2.

In both Embodiments, the phase-detector circuit 10 includes four phase comparators PD_A to PD_D, and the phase difference between the four clock signals is 90 degrees for each, although the number thereof is not limited to four. For example, six phase comparators can be provided. In this case, the number of clock signals is six and the phase difference therebetween is 60 degrees.

According to the Embodiments of the present invention, up and down signals can be output having sufficient pulse width even in high-speed communication.

Although Embodiments of the present invention have been described above, the present invention is not limited thereto. It should be appreciated that variations may be made in the embodiments described by persons skilled in the art without departing from the scope of the present invention.

What is claimed is:
1. A phase-detector circuit, comprising:
a plurality of phase comparators which (i) detect a phase difference between received data and a clock signal of a plurality of clock signals having the same frequency and phase difference of a predetermined angle with each other, and (ii) generate and output signals for up/down signals for synchronizing a phase, wherein a first phase comparator amongst the plurality of phase comparators generates and outputs a signal for the up/down signals having a pulse width including a detected phase-difference time and a predetermined delay time, and wherein the pulse width of the signal output by the first phase comparator becomes longer in each and every instance that the predetermined delay time included in the signal becomes longer, and wherein the predetermined delay time is determined according to a reset signal to the first phase comparator.

2. A phase-detector circuit, comprising:
a reset-signal generator which (i) receives a plurality of clock signals having the same frequency and phase difference of a predetermined angle with each other, and (ii) generates a plurality of reset signals having a predetermined phase difference angle according to each clock signal;
a plurality of phase comparators which receive received data, a predetermined clock signal, and the reset signals to generate signals for an up/down signal for a phase synchronization; and
a plurality of OR circuits in which one of a plurality of up signals is generated from a logical addition of a signal for the up signal output from a predetermined phase comparator and a signal for the up signal output from another predetermined phase comparator, wherein
each of the phase comparators generates the up signal so as to have a pulse width including a time difference between a transition edge of the received data and a falling edge of one of the reset signals, and when the up signal has such a pulse width, the phase comparator generates the down signal so as to have a pulse width including a time difference between a rising edge of the clock signal and the falling edge of another of the reset signals.

3. A phase-detector circuit, comprising:
a reset-signal generator which receives clock signals 0 to 3 having the same frequency and phase difference of 90 degrees with each other to generate reset signals A0, A1, B0, B1, C0, C1, D0, and D1 according to the clock signals 0 to 3;
a phase comparator A which receives received data, clock signal 0, clock signal 2, reset signal A0 and reset signal A1 to generate a signal AU for an up signal and a signal AD for a down signal which are used in a phase synchronization;
a phase comparator B which receives the received data, clock signal 0, clock signal 2, reset signal B0, and reset signal B1 to generate a signal BU for the up signal and a signal BD for the down signal;
a phase comparator C which receives the received data, clock signal 0, clock signal 2, reset signal C0, reset signal C1 to generate a signal CU for the up signal and a signal CD for the down signal;
a phase comparator D which receives the received data, clock signal 0, clock signal 2, reset signal D0, and reset signal D1 to generate a signal DU for the up signal and a signal DD for the down signal;
an OR circuit K1 which receives the signal AU for the up signal and the signal CU for the up signal to generate an up signal UP1 from a logical addition of the signal AU and the signal CU;
an OR circuit K2 which receives the signal BU for the up signal and the signal DU for the up signal to generate an up signal UP2 from a logical addition of the signal BU and the signal DU;
an OR circuit K3 which receives the signal AD for the down signal and the signal CD for the down signal to generate a down signal DN1 from a logical addition of the signal AD and the signal CD;
and an OR circuit K4 which receives the signal BD for the down signal and the signal DD for the down signal to generate a down signal DN2 from a logical addition of the signal BD and the signal DD, wherein
the phase comparator A generates the signal AU for the up signal so as to have a pulse width including a time difference between a transition edge of the received data and a falling edge of the reset signal A0, and generates the signal AD for the down signal to have a pulse width including a time difference between a rising edge of the clock signal 2 and a falling edge of the reset signal A1 when the signal AU has such a pulse width,
the phase comparator B generates the signal BU for the up signal so as to have a pulse width including a time difference between a transition edge of the received data and a falling edge of the reset signal B0, and generates the signal BD for the down signal to have a pulse width including a time difference between a rising edge of the clock signal 0 and a falling edge of the reset signal B1 when the signal BU has such a pulse width,
the phase comparator C generates the signal CU for the up signal so as to have a pulse width including a time difference between a transition edge of the received data and a falling edge of the reset signal C0, and generates the signal CD for the down signal to have a pulse width including a time difference between a rising edge of the clock signal 2 and a falling edge of the reset signal C1 when the signal CU has such a pulse width, and
the phase comparator D generates the signal DU for the up signal so as to have a pulse width including a time difference between a transition edge of the received data and a falling edge of the reset signal D0, and generates the signal DD for the down signal to have a pulse width including a time difference between a rising edge of the clock signal 0 and a falling edge of the reset signal D1 when the signal DU has such a pulse width.

4. A clock-data recovery circuit, comprising:
the phase-detector circuit according to claim 3;
a charge pump which receives up signals UP1 and UP2 and the down signals DN1 and DN2, and generates an output signal CPOUT corresponding to the pulse width of the signals;
a loop filter which receives the output signal CPOUT and generates a control signal VCONT corresponding to a voltage of the output signal CPOUT;
a voltage-control oscillator which receives the control signal VCONT and generates the clock signals 0, 1, 2, 3 having a frequency corresponding to the control signal VCONT; and
a data-sampling part which receives the clock signals 0 and 2 being output from the voltage-control oscillator and the received data and generates recovery data and a recovery-clock signal.

5. The clock-data recovery circuit according to claim 4, further comprising:
a frequency divider which receives the clock signal 0 and the received data and generates a frequency-divided clock signal by dividing the frequency of the clock signal 0 and frequency-divided data by dividing the frequency of the received data;

a phase-frequency comparator which receives the frequency-divided clock signal and the frequency-divided data, generates a difference between the rising edge of the signal as an up-difference signal, and generates a difference between the falling edges of the signals as a down-difference signal; and an up/down-signal selector which receives the up-difference signal and the down-difference signal from the phase-frequency comparator, receives the up signals UP1 and UP2 and the down signals DN1 and DN2 from the phase-detector circuit, selects and outputs the up-difference signal and the down-difference signal or the up signals UP1 and UP2 and the down signals DN1 and DN2 according to a frequency-lock signal which indicates that the frequencies of the received data and the clock signal are synchronized, wherein either (i) the up-difference signal and the down-difference signal or (ii) the up signals UP1 and UP2 and the down signals DN1 and DN2 output from the up/down-signal selector are input to the charge pump.

\* \* \* \* \*